(12) United States Patent
Nishino et al.

(10) Patent No.: US 6,882,178 B2
(45) Date of Patent: Apr. 19, 2005

(54) INPUT CIRCUIT

(75) Inventors: Akira Nishino, Tokyo (JP); Masahisa Nemoto, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 50 days.

(21) Appl. No.: 10/305,966

(22) Filed: Nov. 29, 2002

(65) Prior Publication Data

US 2003/0234662 A1 Dec. 25, 2003

(30) Foreign Application Priority Data

Jun. 24, 2002 (JP) ........................................ 2002-182357

(51) Int. Cl.[7] .......................................... H03K 19/0175
(52) U.S. Cl. ............................. 326/66; 326/84; 326/126
(58) Field of Search ............................. 326/66, 84, 109, 326/110, 115, 126, 127

(56) References Cited

U.S. PATENT DOCUMENTS 5,117,123 A * 5/1992 Sendelweck ................ 327/378
5,561,382 A * 10/1996 Ueda et al. .................... 326/66
6,140,834 A * 10/2000 Takahashi ..................... 326/21
6,249,178 B1 * 6/2001 Umeda ........................ 327/563
6,320,413 B1 11/2001 Kurisu
6,603,348 B1 * 8/2003 Preuss et al. ................ 327/563

FOREIGN PATENT DOCUMENTS

| JP | 59-163857 | 9/1984 |
| JP | 09-162716 | 6/1997 |
| JP | 2000-341108 | 12/2000 |

* cited by examiner

Primary Examiner—Vibol Tan
(74) Attorney, Agent, or Firm—Volentine Francos & Whitt PLLC

(57) ABSTRACT

An input circuit comprises an input terminal for receiving an input signal, an output terminal for outputting an output signal, a node connected to the input terminal, a terminating resistor connected between the node and a ground, a potential shift element connected between the node and the output terminal, a potential source for supplying a predetermined potential, and a current source connected between the potential source and the output terminal.

12 Claims, 5 Drawing Sheets

INPUT CIRCUIT

BACKGROUND OF THE INVENTION

The present invention relates to an input circuit, and particularly to an input circuit that is low in loss, easy to take AC coupling and provides less power consumption.

As an example of a conventional input circuit, three has been known one disclosed in the following literature. "Low Power-Consumption 10 Gb/s EA Modulator Driver IC", 1998 Society Conference of the Institute of Electronics, Information and Communication Engineers, C-10-16, p63

An input circuit section of a circuit shown in FIG. 1 of the present literature has been described as a conventional circuit in FIG. 5. The conventional input circuit will be explained below while referring to FIG. 5.

A signal input terminal IN is connected to one electrode of an input terminating resistor R1 and the gate of a first field effect transistor (hereinafter called an "FET") Q1. The other electrode of the input terminating resistor R1 and the drain of the first FET Q1 are connected to a ground GND. The source of the first FET Q1 is connected to the anode of a level shift diode D1. The cathode of the level shift diode D1 is connected to an output terminal OUT and the drain of a second FET Q2. The gate and source of the second FET Q2 are connected to a negative potential source VS.

In the circuit shown in FIG. 5, the first FET Q1 operates as a drain grounded amplifier, and the second FET Q2 is a source follower circuit operated as a current source. A signal inputted to the input terminal IN is reduced in potential by the level shift diode D1, which in turn is outputted to the output terminal OUT. The input circuit shown in FIG. 5 is connected to a pre-stage circuit in the form of CML (Current Mode Logic) coupling. In this case, the input circuit operates according to the flowing of a current signal Iin of the pre-stage circuit into the terminating circuit R1.

Assuming that a gate-to-source voltage of an FET is given as vgs, a drain-to-source voltage thereof is given as vds, a mutual conductance thereof is given as gm and a drain conductance thereof is given as gd, a drain current id of the FET is generally represented by the following [equation 1].

$$id = gm*(vgs-vth) + gd*vds \quad \text{[equation 1]}$$

Let's assume that in FIG. 5, an input voltage is represented as vin, an output voltage is represented as vout, a level shift voltage of the level shift diode D1 is represented as vf, mutual conductances of the first and second FETs Q1 and Q2 are represented as gm, drain conductances thereof are represented as gd, threshold voltages of the first and second FETs Q1 and Q2 are represented as vth, and a voltage value of the negative potential source VS is represented as vs, respectively, and each of the first and second FETs Q1 and Q2 is operated in a saturated region. A drain current id1 of the first FET Q1 is represented by the following [equation 2]:

$$id1 = gm*(vin-vout+vf-vth) + gd*(vf-vout) \quad \text{[equation 2]}$$

Further, a drain current id2 of the second FET Q2 is represented by the following [equation 3]:

$$id2 = gm*(-vth) + gd*(vout-vs) \quad \text{[equation 3]}$$

Since id1=id2 in the case of the source follower circuit herein, the output voltage is given by the [equation 2] and [equation 3] as follows:

$$vout = \{gm/(gm+2*gd)\}*vin + \{gd*vs + (gm+gd)*vf\}/(gm+2 \cdot gd) \quad \text{[equation 4]}$$

A loss LS1 of this circuit is determined by differentiating the [equation 4] with vin, which is represented as follows:

$$LS1 = gm/(gm+2*gd) \quad \text{[equation 5]}$$

However, the above-described input circuit is high in loss as represented by the [equation 5]. Assuming that as numerical examples, for example, the mutual conductance gm of the FET is 500 mS (Siemens: reciprocal of $\Omega$) per gate width of 1 mm, and the drain conductance gd of the FET is 30 mS per gate width of 1 mm, the loss results in 0.98 dB from the [equation 5].

Since the gate voltage of the first FET Q1 takes the same potential as the ground where the above-described input circuit and pre-stage circuit are connected to each other in the form of AC coupling, an operating point of the first FET Q1 results in an FET's linear region, thus causing a problem that the loss further increases.

Further, when the current of the current source is reduced in the case of the conventional input circuit, the operating point of the first FET Q1 changes and the mutual conductance gm is lowered. Thus, a problem arises in that since the first FET Q1 is degraded in drive capacity, the current cannot be cut down.

SUMMARY OF THE INVENTION

The present invention may solve the foregoing problems and also provide an input circuit, which is capable of ensuring an operation even if a current is reduced, and is low in loss.

An input circuit of the present invention comprises an input terminal for receiving an input signal, an output terminal for outputting an output signal, a node connected to the input terminal, a terminating resistor connected between the node and a ground, a potential shift element connected between the node and the output terminal, a potential source for supplying a predetermined potential, and a current source connected between the potential source and the output terminal.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

Figure 1:
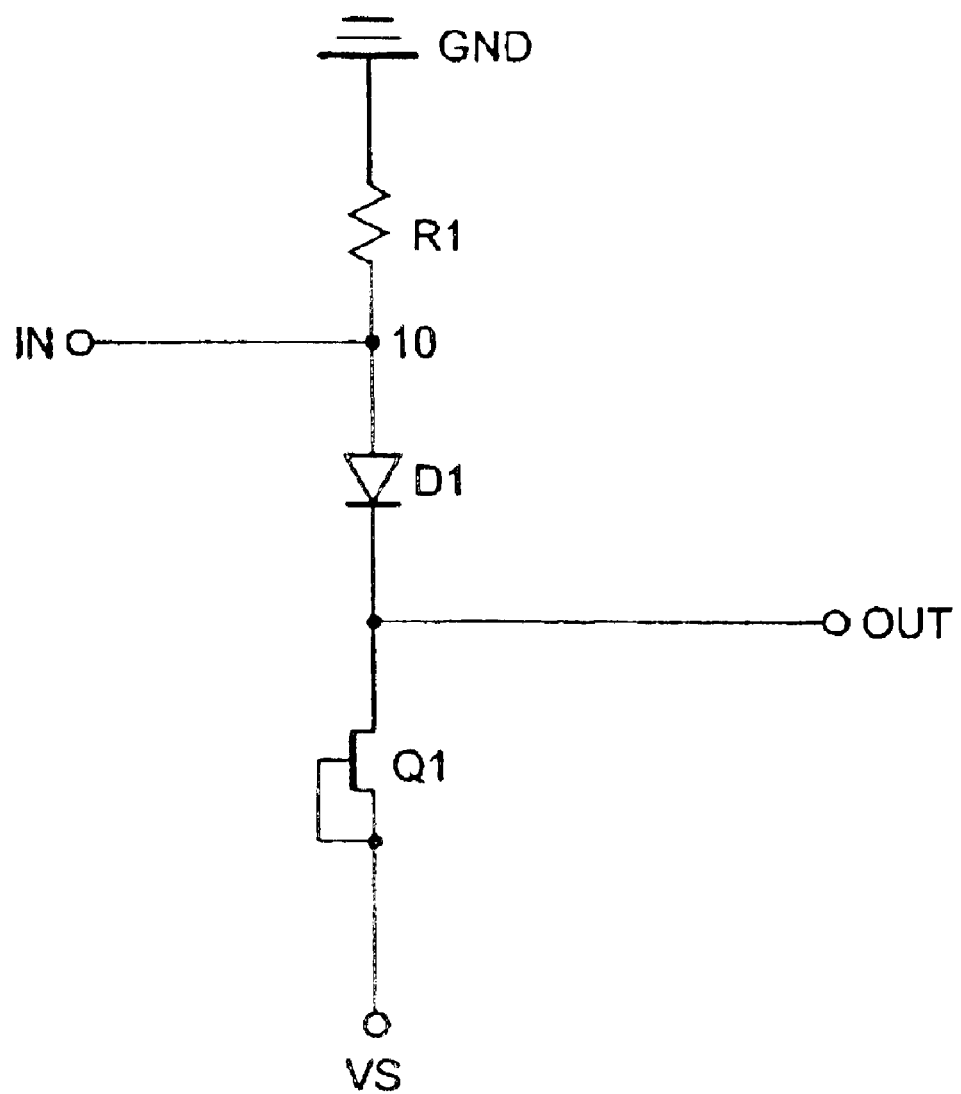
FIG. 1 is a circuit diagram showing an input circuit according to a first embodiment of the present invention.

An input circuit according to a first embodiment of the present invention is shown in FIG. 1. The first embodiment of the present invention will be described below while referring to FIG. 1.

In the input circuit according to the first embodiment of the present invention, a signal input terminal IN is connected to a node 10 without being connected to the gate of a transistor Q1. The node 10 is connected to a ground GND via an input terminating resistor R1. Further, the node 10 is connected even to the anode of a level shift diode D1. The cathode of the level shift diode D1 is connected to an output terminal OUT and the drain of the transistor Q1. The source and gate of the transistor Q1 are connected to a negative-potential source or power supply VS such as −5V or the like.

In the input circuit according to the first embodiment, the transistor Q1 operates as a current source. A signal inputted to the input terminal IN is reduced in potential by the level shift diode D1 after which it is outputted to the output terminal OUT. When a loss LS2 of the present circuit is determined in a manner similar to the conventional circuit assuming that an input voltage, an output voltage, a level shift voltage produced from the level shift diode D1, a mutual conductance of the transistor Q1, a drain conductance of the transistor Q1, a threshold voltage of the transistor Q1, the voltage of the negative source voltage VS, and the resistance value of the terminating resistor R1 are respectively represented as vin, vout, vf, gm, gd, vth, vs and r, it is expressed like the following [equation 6]:

$$LS2=1/(1+r*gd) \quad \text{[equation 6]}$$

Assuming that, for example, the drain conductance gd of the transistor Q1 is given as 30 mS per gate width of 1 mm, and the resistance value of the terminating resistor is given as 50Ω, the loss results in 0.13 dB according to the [equation 6].

In the input circuit according to the first embodiment, the potential of the input applied thereto is determined according to the flowing of an output current Iin of a pre-stage circuit for outputting the signal to the input terminal IN, and a drain current Id1 of the transistor Q1 into the terminating resistor R1. Reducing the drain current Id1 sufficiently as compared with the output current Iin enables CML coupling.

In the input circuit according to the first embodiment as well, the input terminal IN is not directly connected to the transistor. Thus, the operating point of the transistor that constitutes the circuit is always brought to a saturated region even in the case of AC coupling, so that the loss of the circuit does not increase.

Incidentally, since the terminating resistor R1 is grounded, no mismatch is produced in input impedance even when the frequency of the input signal becomes greater than or equal to 10 GHz.

According to the first embodiment as described above, the loss can be significantly reduced as compared with the conventional input circuit. An advantageous effect can be obtained in that no loss increases even upon the AC coupling.

Further, the CML coupling is also enabled by setting low the value of the current that flows through the transistor constituting the current source. Since the input circuit according to the first embodiment does not use the transistor in a signal-passing path lying between the input terminal IN and the output terminal OUT, no drive capacity is degraded even if the current of the current source is reduced. Therefore, an advantageous effect is obtained in that the input circuit can be reduced in power consumption.

Figure 2:
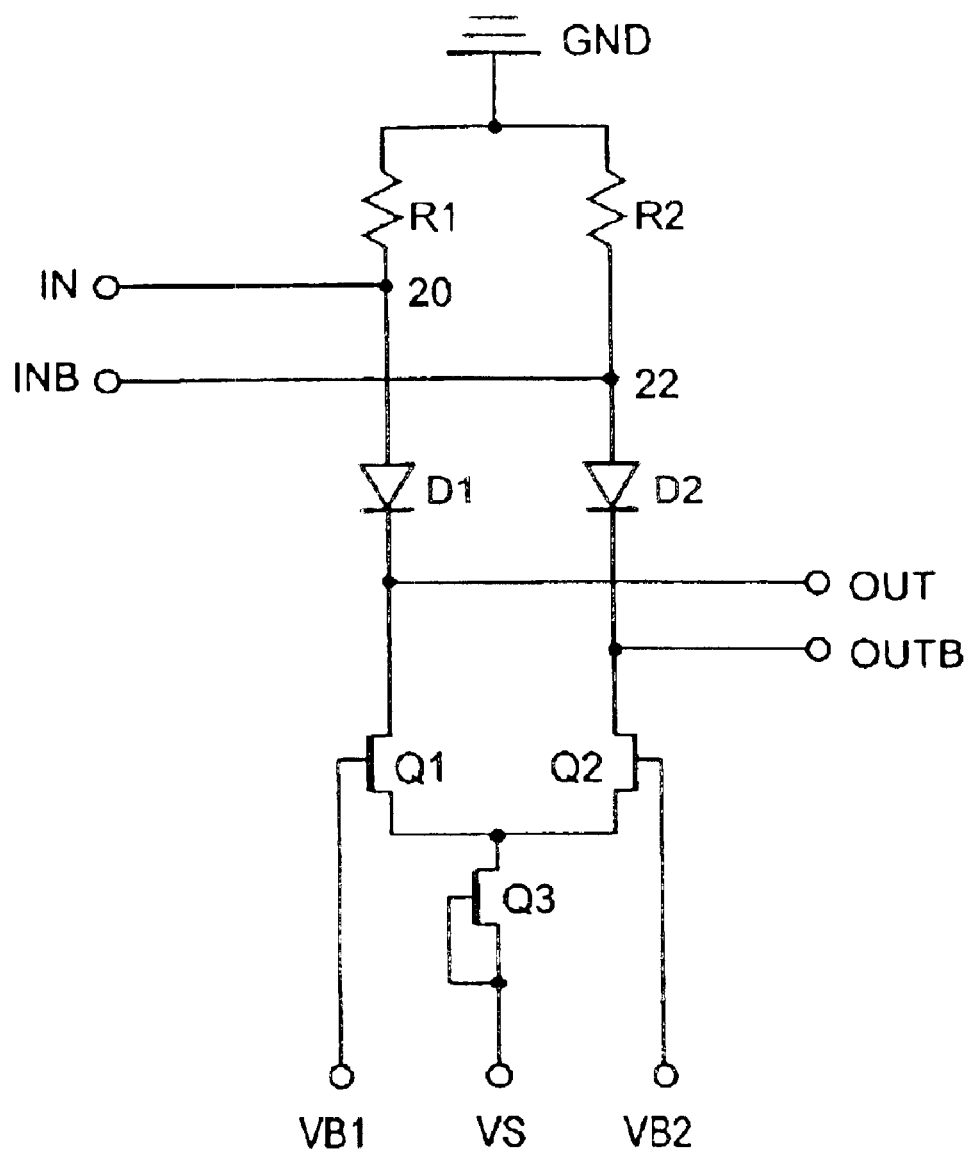
FIG. 2 is a circuit diagram illustrating an input circuit according to a second embodiment of the present invention.

An input circuit according to a second embodiment of the present invention is next shown in FIG. 2. The second embodiment of the present invention will be described below while referring to FIG. 2.

The input circuit according to the second embodiment of the present invention has a positive-phase signal input terminal IN and a negative-phase or inverted-phase signal input terminal INB. The positive-phase signal input terminal IN is connected to a first node 20 without being connected to the gate of a transistor in a manner similar to the first embodiment. The negative-phase signal input terminal INB is also connected to a second node 22 without being connected to the gate of the transistor in a manner similar to the first embodiment. The first node 20 is connected to a ground GND via a first input terminating resistor R1. The second node 22 is connected to the ground GND via a second input terminating resistor R2. Further, the first node 20 is connected even to the anode of a first level shift diode D1. Similarly, the second node 22 is connected to the anode of a second level shift diode D2. The cathode of the first level shift diode D1 is connected to a positive-phase output terminal OUT and connected to the drain of a first transistor Q1. The cathode of the second level shift diode D2 is connected to a negative-phase or antiphase output terminal OUTB and connected to the drain of a second transistor Q2.

The gate of the first transistor Q1 is connected to a first current adjusting terminal VB1. Similarly, the gate of the second transistor Q2 is connected to a second current adjusting terminal VB2. The sources of the first and second transistors Q1 and Q2 are commonly connected to the drain of a third transistor Q3. The source and gate of the third transistor Q3 are connected to a negative-potential source or power supply VS such as −5V.

In the input circuit according to the second embodiment, the third transistor Q3 operates as a current source. The first and second transistors Q1 and Q2 operate as a differential circuit. Voltage values applied to the first and second current adjusting terminals VB1 and VB2 make it possible to change the values of currents flowing through the first and second input terminating resistors R1 and R2. Namely, the first and second transistors Q1 and Q2 serve as current adjusting elements respectively. It is thus possible to arbitrarily change the potentials at the positive-phase and negative-phase output terminals OUT and OUTB.

A signal inputted to the positive-phase signal input terminal IN is lowered in potential by the first level shift diode D1 and outputted to the positive-phase output terminal OUT. A signal inputted to the antiphase input terminal INB is reduced in potential by the second level shift diode D2, after which it is outputted to the negative-phase output terminal OUTB.

Let's determine a loss of one side (positive-phase input terminal IN, first input terminating resistor R1, first transistor Q1, positive-phase output terminal OUT and third transistor Q3). Assuming that the gate of the first transistor Q1 is supplied with a ground potential, the third transistor Q3 operates a current source and performs an operation equivalent to a cascode-connected current source. Assuming that the drain conductances of the first and third transistors Q1 and Q3 are represented as gd, a drain conductance gd2 of a cascode current source comprising the first and third transistors Q1 and Q3 is represented as follows [equation 7]:

$$gd2=gd*gd/(gm+2*gd) \quad \text{[equation 7]}$$

When it is substituted into the above [equation 6], a loss LS3 of the input circuit according to the second embodiment is represented as the following [equation 8]:

$$LS3=1/\{1+r*gd*gd/(gm+2*gd)\} \quad \text{[equation 8]}$$

Assuming that, for example, the mutual conductance gm of each of the first and third transistors Q1 and Q3 is 500 mS per gate width of 1 mm, the drain conductance gd of each of the first and third transistors Q1 and Q3 is 30 mS per gate width of 1 mm, and the resistance value of the first terminating resistor R1 is 50Ω, the loss results in 0.0006 dB from the [equation 8].

Incidentally, although not described in detail, a loss of the other side (negative-phase input terminal TNB, second input terminating resistor R2, second transistor Q2, negative-phase output terminal OUTB and third transistor Q3) of the input circuit according to the second embodiment is similar to the above even if it is determined.

Since the first and second terminating resistors R1 and R2 are grounded, no mismatch is produced in input impedance even when the frequencies of the positive-phase and negative-phase input signals reach 10 GHz or more in a manner similar to the first embodiment.

As described above, the input circuit according to the second embodiment of the present invention enables a further reduction in loss as compared with the input circuit according to the first embodiment.

As described above, the input circuit according to the second embodiment is capable of arbitrarily changing the potentials at the positive-phase and negative-phase input terminals OUT and OUTB. Thus, a logic threshold value can be changed where the present embodiment is used in an input circuit of a liming amplifier or the like, for example. When the present embodiment is used in an input circuit of a modulator drive amplifier for optical communications or the like, the duty of an output can be changed.

Figure 3:
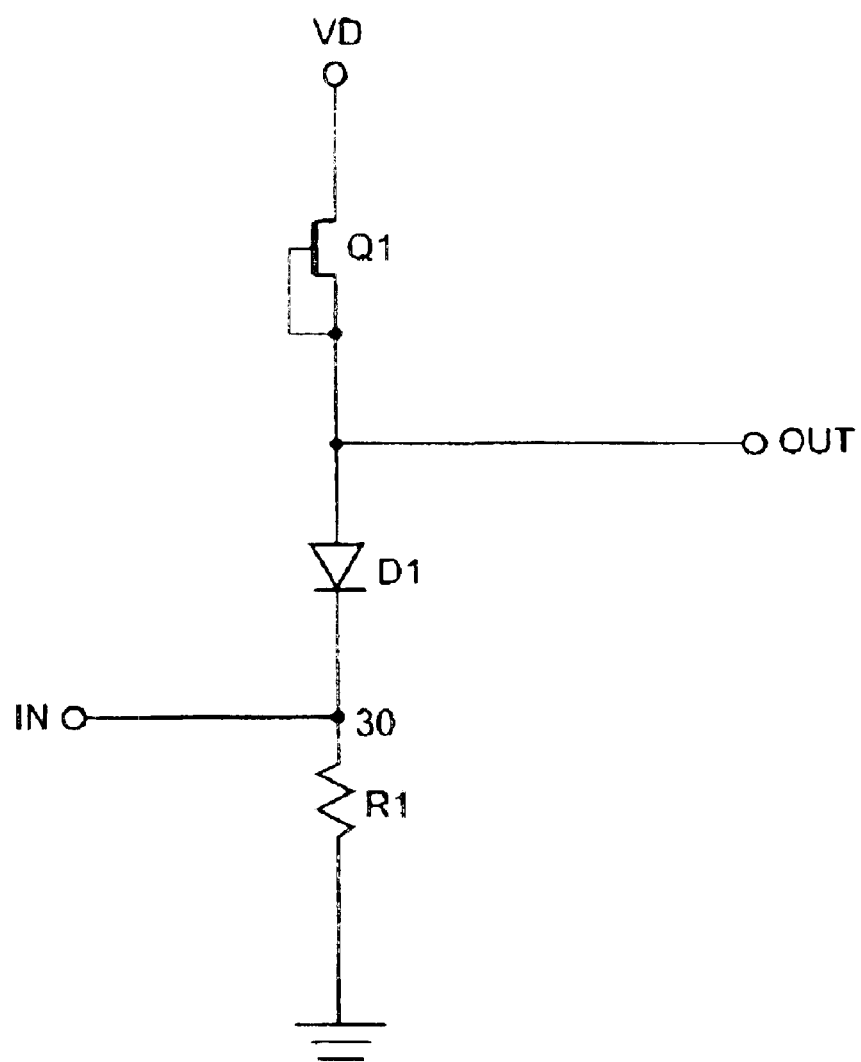
FIG. 3 is a circuit diagram depicting an input circuit according to a third embodiment of the present invention.

An input circuit according to a third embodiment of the present invention is shown in FIG. 3. The third embodiment of the present invention will be explained below with reference to FIG. 3.

In the input circuit according to the third embodiment of the present invention, a signal input terminal IN is connected to a node 30. The node 30 is connected to a ground GND via an input terminating resistor R1. Further, the node 30 is connected even to the cathode of a level shift diode D1. The anode of the level shift diode D1 is connected to an output terminal OUT and connected to the source and gate of a transistor Q1. The drain of the transistor Q1 is connected to a positive-potential source or power supply VD such as 5V.

The input circuit according to the third embodiment is an input circuit that makes use of the positive-potential source VD. In the input circuit according to the third embodiment, the transistor Q1 operates a current source. A signal inputted to the input terminal IN is raised in potential by the level shift diode D1, after which it is outputted to the output terminal OUT.

Since the terminating resistor R1 is grounded in a manner similar to the first embodiment, no mismatch is developed in input impedance even if the frequency of the input signal is brought to 10 GHz or more.

Figure 4:
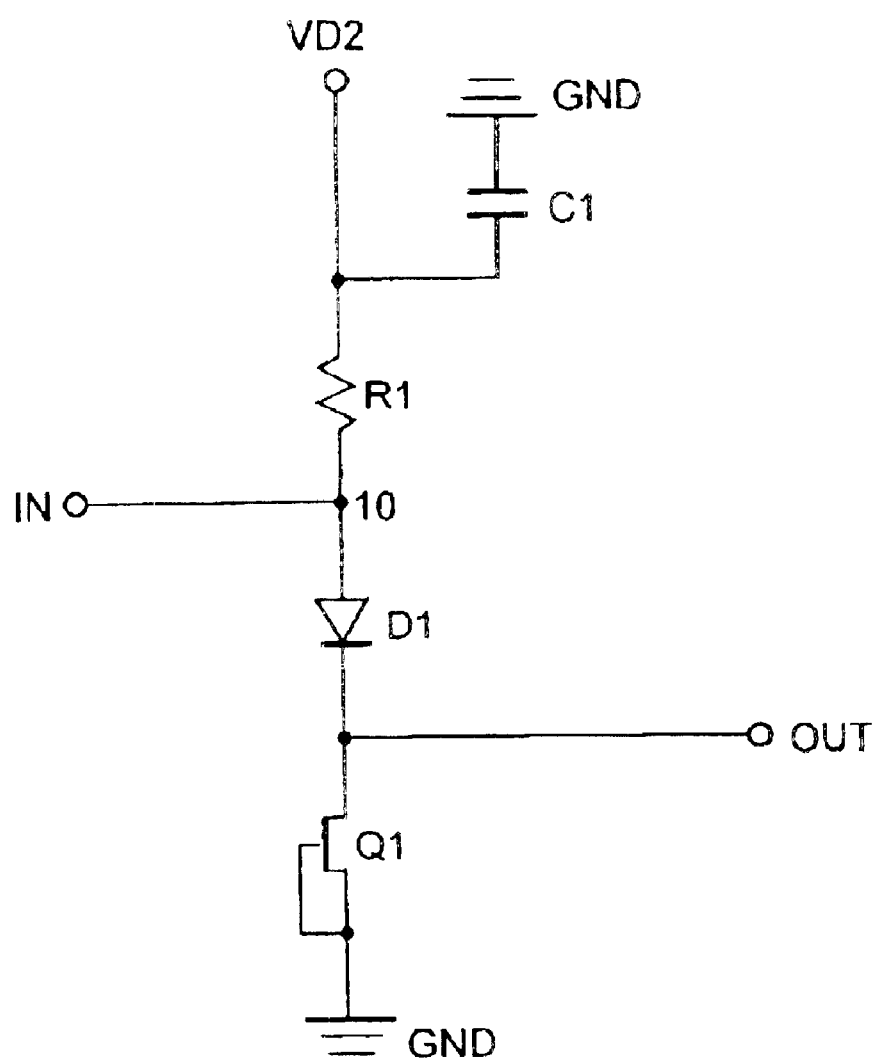
FIG. 4 is a circuit diagram showing an input circuit according to a modification of the first embodiment of the present invention.
Figure 5:
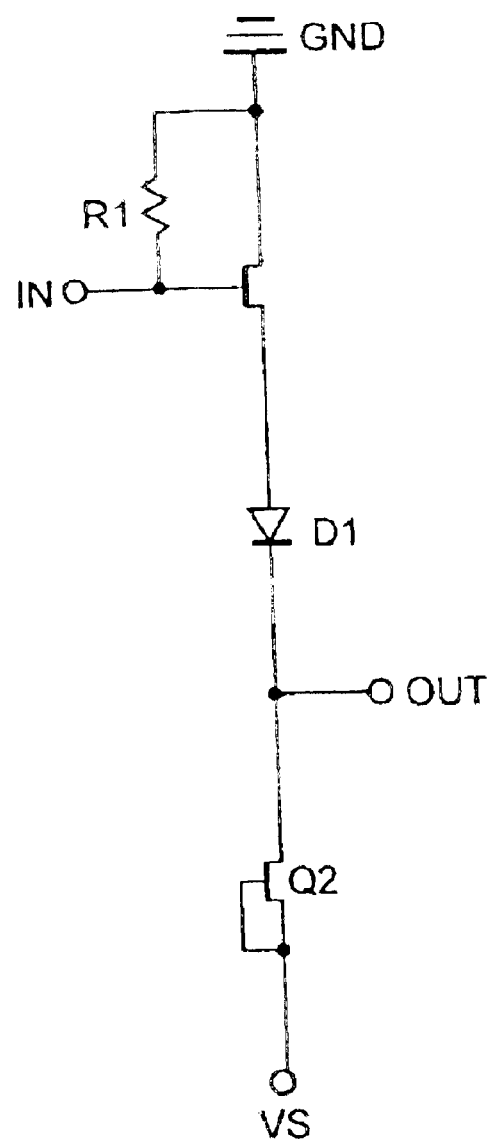
FIG. 5 is a circuit diagram illustrating a conventional input circuit.

An input circuit according to a modification of the first embodiment of the present invention is illustrated in FIG. 4 to make a comparison with the third embodiment of the present invention. The input circuit according to the modification of the first embodiment is equivalent to an example that makes use of a positive source or power supply. The modification will be explained below with reference to FIG. 4.

In the input circuit according to the modification, a signal input terminal IN is connected to a node 10. The node 10 is connected to a potential source VD2 corresponding to a positive potential via an input terminating resistor R1. The node 10 is also connected to one terminal of an AC grounded capacitor C1 through the input terminating resistor R1. The other terminal of the AC grounded capacitor C1 is grounded (GND). Further, the node 10 is connected to the anode of a level shift diode D1. The cathode of the level shift diode D1 is connected to an output terminal OUT and the drain of a transistor Q1. The source and gate of the transistor Q1 are grounded (GND).

While the circuit using the negative power supply has been described in the first embodiment, the positive power supply is used in the circuit according to the modification. In the circuit according to the modification, the input terminating resistor R1 is connected to the power terminal (potential source VD2 corresponding to the positive potential) without being connected to the ground GND. When the circuit is considered in a practical level, the impedance of the power supply becomes high as compared with the ground as the frequency increases. Therefore, the impedance of the input results in the sum of the terminating resistor R1 and the impedance of the power supply VD2, and thereby makes a large shift to the characteristic impedance, thus causing mismatching. It is therefore necessary to provide the AC grounded capacitor C1 and virtually ground AC. While the AC grounded capacitor C1 is illustrated only as single in FIG. 2, the capacitance of a chip part or the like normally has a self resonant frequency and a frequency band usable depending on the capacitance value is limited. Therefore, an IC like, e.g., an IC for optical communications or the like, which needs impedance matching in a broad band, particularly a frequency domain ranging from several tens of kHz to 10 GHz or higher, must make use of a plurality of capacitances and set capacitance values according to frequency bands. It is therefore difficult to match the impedance of the input to the above impedance.

Since, however, the positive power supply is used but the terminating resistor R1 is grounded in the third embodiment of the present invention, matching equivalent to the case where the circuit is used under the negative power supply of the first embodiment, is obtained.

Further, the circuit according to the third embodiment is capable of reducing the current of the current source in a manner similar to the input circuit according to the first embodiment and can reduce power consumption as well. Incidentally, the present invention is not limited to the first through third embodiments and various modifications can be made thereto.

While the level shift diode is illustrated as one stage in the first through third embodiments, a similar advantageous effect is obtained even when the level shift diode is used in the form of plural stages, for example. While a potential-variable one (potential shift element) such as a resistor or the like is adopted as the level shift diode, a similar advantageous effect is obtained. Further, while the field effect transistors are used in the first through third embodiments, a similar advantageous effect is obtained even in the case of, for example, a bipolar transistor or the like. While the first through third embodiments are illustrated in the form of the configurations wherein the gates and sources of the transistors each used as the current source are respectively connected to one another, the gates and sources may be respectively set to different potentials. The present invention is effective even for an input circuit having a configuration provided with a capacitor (speed-up capacitor) in parallel with a level shift diode to improve high frequency characteristics in the first through third embodiments.

While the single end circuit has been shown in the third embodiment, a similar advantageous effect is obtained even in the case of the difference circuit like the second embodiment.

While the second embodiment has shown the configuration for adjusting the voltages at the two VB1 and VB2 used as the current source adjusting terminals, a fixed voltage may be applied to one thereof and adjusted at the other thereof.

While the current source is made up of one transistor in the first embodiment, a current source in which transistors are cascode-connected, may be used. In this case, one equivalent to the second embodiment is obtained as the loss.

According to the input circuit of the present invention as described above in detail, the loss can be greatly reduced, and no loss increases even upon AC coupling.

Setting low the value of the current flowing through the transistor constituting the current source enables CML coupling as well. Further, since the drive capacity is not degraded even if the current of the current source is reduced, the input circuit can be reduced in power consumption.

What is claimed is:

1. An input circuit comprising:
    an input terminal for receiving an input signal;
    an output terminal for outputting an output signal;
    a node connected to said input terminal;
    a terminating resistor connected between said node and a ground;
    a potential shift element connected between said node and said output terminal;
    a potential source for supplying a predetermined potential; and
    a current source connected between said potential source and said output terminal;
    wherein said potential source is a positive potential source, wherein said current source is a transistor, and wherein the transistor has a source and a gate connected to said output terminal and a drain connected to the positive potential source.

2. The input circuit according to claim 1, wherein said potential shift element is a diode.

3. The input circuit according to claim 2, wherein the diode has an anode connected to said output terminal and a cathode connected to said node.

4. An input circuit comprising:
    a positive-phase input terminal for receiving a positive-phase input signal;
    a negative-phase input terminal for receiving a negative-phase input signal;
    a positive-phase output terminal for outputting a positive-phase output signal therefrom;
    a negative-phase output terminal for outputting a negative-phase output signal therefrom;
    a first node connected to said positive-phase input terminal;
    a second node connected to said negative-phase input terminal;
    a first terminating resistor connected between said first node and a ground;
    a second terminating resistor connected between said second node and the ground;
    a first potential shift element connected between said first node and said positive-phase output terminal;
    a second potential shift element connected between said second node and said negative-phase output terminal;
    a potential source for supplying a predetermined potential;
    a current source connected to said potential source;
    a first current adjusting element connected between said current source and said positive-phase output terminal; and
    a second current adjusting element connected between said current source and said negative-phase output terminal.

5. The input circuit according to claim 4, wherein said potential source is a negative potential source.

6. The input circuit according to claim 5, wherein said first and second potential shift elements are diodes respectively.

7. The input circuit according to claim 6, wherein said each diode has an anode connected to said first or second node and a cathode connected to the corresponding output terminal.

8. The input circuit according to claim 7, wherein said current source is a transistor.

9. The input circuit according to claim 8, wherein the transistor has a source and a gate connected to the negative potential source.

10. The input circuit according to claim 4, wherein said first and second current adjusting elements are transistors respectively.

11. An input circuit comprising:
    an input terminal for receiving an input signal;
    an output terminal for outputting an output signal;
    a node connected to said input terminal;
    a potential source for supplying a predetermined potential;
    a terminating resistor connected between said node and said potential source;
    a capacitor connected between said potential source and a ground;
    a potential shift element connected between said node and said output terminal; and
    a current source connected between said ground and said output terminal.

12. The input circuit according to claim 11, wherein said potential source is a positive potential source, wherein said potential shift element is a diode, and wherein said diode has an anode connected to said node and a cathode connected to said output terminal.

* * * * *